United States Patent [19]

Ribic

[11] Patent Number: 5,633,937
[45] Date of Patent: May 27, 1997

[54] METHOD FOR PROCESSING SIGNALS

[75] Inventor: Zlatan Ribic, Vienna, Austria

[73] Assignee: Viennatone AG, Vienna, Austria

[21] Appl. No.: 265,694

[22] Filed: Jun. 24, 1994

Related U.S. Application Data

[63] Continuation of Ser. No. 970,140, Nov. 2, 1992, abandoned.

[30] Foreign Application Priority Data

Nov. 13, 1991 [AT] Austria ................................ 2245/91

[51] Int. Cl.⁶ .................................................. H04R 25/00
[52] U.S. Cl. ........................... 381/68.4; 381/94; 381/106
[58] Field of Search .......................... 381/68.4, 94, 106, 381/68.2, 62, 38; 84/706; 328/15

[56] References Cited

U.S. PATENT DOCUMENTS

| | | | |
|---|---|---|---|
| 4,071,695 | 1/1978 | Flanagan et al. | |
| 4,182,993 | 1/1980 | Tyler | 330/279 |
| 4,398,158 | 8/1983 | Rodgers | 330/136 |
| 4,410,764 | 10/1983 | Werth et al. | 364/513.5 |
| 4,495,643 | 1/1985 | Orban | 381/94 |
| 4,701,953 | 10/1987 | White | 381/46 |
| 4,984,188 | 1/1991 | Kato | 364/725 |

FOREIGN PATENT DOCUMENTS

| | | |
|---|---|---|
| 3512405 | 10/1985 | Germany. |
| 57-113646 | 5/1982 | Japan. |
| 1136407 | 5/1989 | Japan. |

OTHER PUBLICATIONS

"Frequency Analysis", Brüel & Kjaer, 1987 (Book pp. 58–77; 146–181).

*Primary Examiner*—Sinh Tran
*Attorney, Agent, or Firm*—Collard & Roe, P.C.

[57] ABSTRACT

Method and apparatus for processing signals, in particular audio signals for hearing aids. A delay-free processing of signals is achieved in that at first a momentary amplitude signal $A(t)$ is produced whose strength is proportional to the momentary amplitude of the input signal $u_i(t)$ and that the momentary amplitude signal $A(t)$ is used for processing the input signal $u_i(t)$.

11 Claims, 6 Drawing Sheets

METHOD FOR PROCESSING SIGNALS

CROSS-REFERENCE TO RELATED APPLICATION

This is a continuation of my U.S. patent application Ser. No. 07/970,140, filed Nov. 2, 1992 now abandoned.

BACKGROUND OF THE INVENTION

1. Field of the Invention

The invention relates to a method for processing signals, in particular audio signals for hearing aids.

2. The Prior Art

A recurring problem in the transmission and amplification of audio signals is the adjustment of the volume to the respective requirements. This problem also arises in the transmission of other signals, such as data signals via modems, for example.

There is a special problem concerning hearing aids in that very low noises have to be amplified very strongly in order to be noticed by the user. However, in some cases loud noises are amplified too strongly, which can be very unpleasant for the user.

A whole range of methods are known for the compression of the signals. These methods have the disadvantage that they require a certain response time. This leads to a delay in the response behavior. Generally, such a delay is not desirable because in this way very quiet sounds that occur directly after louder sounds are covered up.

A further disadvantage consists of the fact that such circuits for compressing the volume are often insufficiently adjustable and controllable or not adjustable at all.

SUMMARY OF THE INVENTION

It is the object of the present invention to avoid these disadvantages and to create a method with which signal processing without reactions times is possible.

In accordance with the invention it is therefore provided that at first a momentary amplitude signal A(t) is generated which is equivalent to the amplitude of the input signal $u_i(t)$ and that said momentary amplitude signal A(t) is used for processing the input signal $u_i(t)$. Because said momentary amplitude signal A(t) is available in real time, it is possible to carry out the signal processing free of delays. Depending on the requirements it is possible to achieve a compression or expansion of the volume.

A compression of the volume is achieved if the input signal $u_i(t)$ is divided by the momentary amplitude signal A(t) which, if required, is multiplied by a constant K. The constant K prevents division by zero. If the constant K is chosen sufficiently small, the output signal has a practically constant amplitude, i.e., a minute volume range. This may be desirable in the case of data transmission systems that use telephone lines.

A particularly simple and far-reaching controllability of signal processing can be achieved by using the momentary amplitude signal A(t) for controlling the amplification of the input signal $u_i(t)$.

In a particularly favorable embodiment of the method in accordance with the invention the following steps are provided:

Generation of an analytical signal, consisting of two Hilbert signals $h_1(t)$, $h_2(t)$, whose energy spectrum is equivalent to that of the input signal $u_i(t)$.

Formation of the square root of the sum of the squares of the two Hilbert signals $h_1(t)$ and $h_2(t)$.

An analytical signal is designated as a complex signal whose imaginary component represents the Hilbert transformation of the real component. The mathematical basics are known and have been explained in detail in R. B. Randall: "Frequency Analysis", Brüel & Kjaer, 1987, for example. Due to this property the two components of the analytical signal will be referred to in short as Hilbert signals.

The Hilbert transformation produces from one function another function whose amplitude spectrum is identical, but whose phase relation is displaced in all frequencies by $\pi/2$. Principally it would be possible to subject the input signal to such a Hilbert transformation. This, however, is very difficult to realize in a circuit. Nevertheless it is easily possible to generate two output signals that both coincide with the input signal in the amplitude spectrum and whose phase relationship between the two output signals is shifted by $\pi/2$. The momentary amplitude signal A(t) is gained in such a way that the square root is formed by the sum of the squares of the two Hilbert signals $h_1(t)$ and $h_2(t)$.

Furthermore, the invention relates to an apparatus for processing signals, in particular audio signals for hearing aids. The apparatus is arranged in accordance with the invention in such a way that an amplitude signal circuit is provided with which a momentary amplitude signal A(t) is produceable whose momentary strength is substantially proportional to the momentary amplitude of the input signal $u_i(t)$ and that furthermore a logic element is provided in which said amplitude signal A(t) is combined with the input signal $u_i(t)$.

It is preferable if the logic element comprises a divider circuit in which the input signal $u_i(t)$ can be divided by the momentary amplitude signal A(t). In this way a strong reduction of the volume range is achieved.

To prevent division by zero an adder as well as an adjustable signal source may be provided, whereby the output of the amplitude signal circuit and the adjustable signal source are connected to the inputs of the adder.

In a preferable embodiment of the invention it is provided that a non-linear transformer is connected to the output of the amplitude signal circuit, which transformer controls a voltage-controlled amplifier for the input signal $u_i(t)$. Depending on the characteristics of the non-linear transformer it is possible to realize any desired transforming function. In combination with the non-linear transformer the voltage-controlled amplifier forms the logic element.

It may also be provided that a timer is connected in series with the non-linear transformer. Said timer, which can be a lag or delay unit, also allows processing based on the slope of signal rises.

Preferably, the amplitude signal circuit comprises the following components:

a Hilbert circuit (HS) with two outputs which are supplied with two Hilbert signals $h_1(t)$ and $h_2(t)$ gained from an input signal $u_i(t)$, which Hilbert signals represent the components of an analytical signal;

a logic circuit which with its two inputs are connected to the outputs of the Hilbert circuit and which produces an output signal A(t) according to the following algorithm from the two signals $h_1(t)$ and $h_2(t)$ that are supplied to the inputs:

$$A(t) = \sqrt{V h_1{}^2(t) + h_2{}^2(t)} \quad .$$

BRIEF DESCRIPTION OF THE DRAWINGS

The invention is now outlined in greater detail by reference to the embodiments schematically represented in the Figures.

DETAILED DESCRIPTION OF THE PREFERRED EMBODIMENTS

Figure 1A:
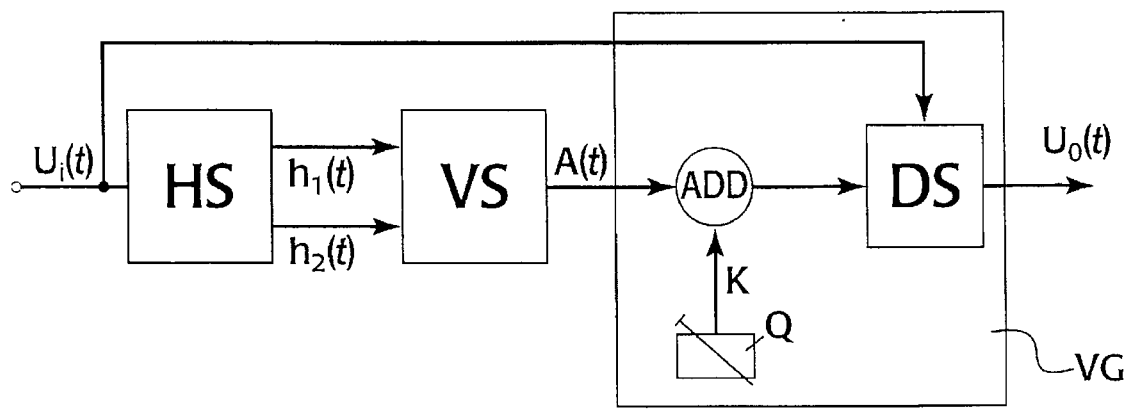
FIGS. 1a, 1b, 2 and 3 show block diagrams of various embodiments of the invention.
Figure 1B:
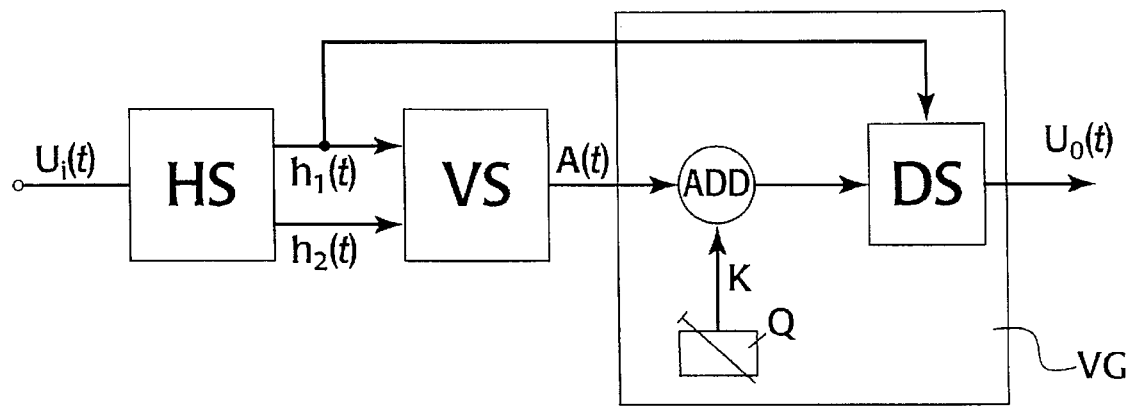

In the embodiment of the invention as shown in FIG. 1 two Hilbert signals $h_1(t)$ and $h_2(t)$ are gained from the input signal $u_i(t)$ by means of the Hilbert circuit HS.

A logic circuit VS is connected with its two inputs to the outputs of the Hilbert circuits. Logic circuit VS produces from the signals $h_1(t)$ and $h_2(t)$ that are supplied to the inputs an output signal A(t) according to the following algorithm where V indicates the voltage of the Hilbert signals:

$$A(t) = \sqrt{V h_1^2(t) + h_2^2(t)} \quad .$$

This momentary amplitude signal A(t) is further processed in the logic element VG. It is increased in an adder ADD by a constant signal K which is produced by an adjustable signal source Q. The following operation is carried out in a divider circuit DS:

$$u_o(t) = h_1(t)/(A(t)+K).$$

With respect to the final result it is not important whether the input signal $u_i(t)$ or, as represented in FIG. 1, a Hilbert signal $h_1(t)$ is used as dividend.

Such a circuit is equivalent to a compressor without transient or decay periods which does not cause distortions for an isolated sound. In the event that several sinusoidal components exist side by side, it is obvious that intermodulation distortions will occur. Despite this, however, the output signal still sounds substantially natural because similar distortions occur in the concha of the human ear.

Figure 2:
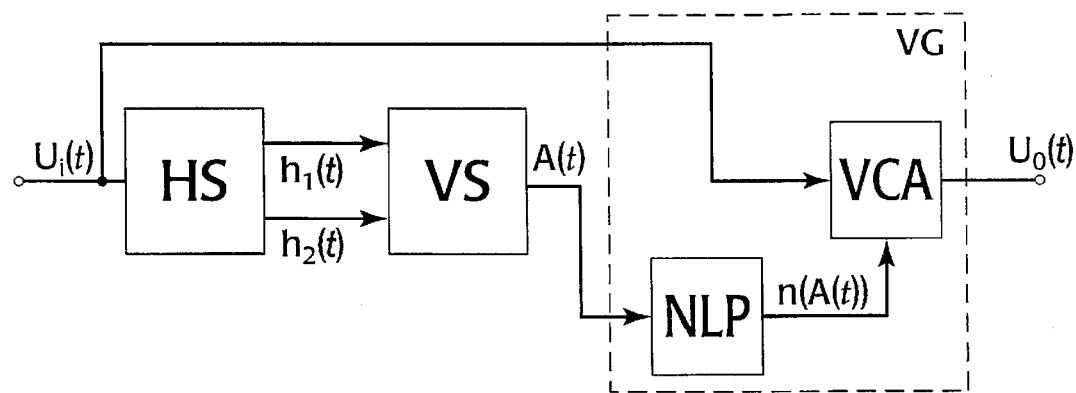

In the embodiment as shown in FIG. 2 the momentary amplitude signal A(t) is supplied via a non-linear transformer NLP to a voltage-controlled amplifier VCA. Said amplifier VCA amplifies the input signal $u_i(t)$ depending on signal n(A(t)) which is supplied to the output of the non-linear transformer NLP. Depending on the characteristics of the non-linear transformer NLP it is possible to set any desired volume behavior. In addition, this also allows providing a control, such as one that depends on the frequency or manual settings.

Figure 3:
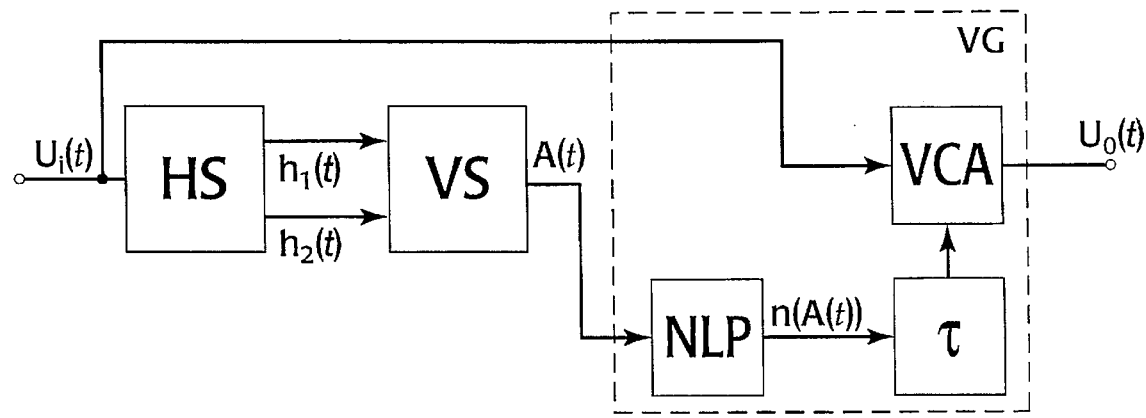

In FIG. 3 a delay unit T is arranged behind the non-linear transformer NLP. This provides the option of also realizing time-selective transforming functions.

Figure 4:
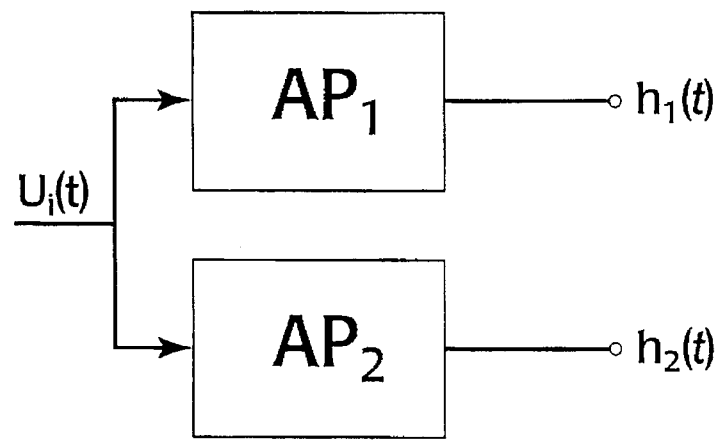
FIG. 4 shows a block diagram of the Hilbert circuit.

FIG. 4 shows that the Hilbert circuit HS can be arranged by at least two all-passes $AP_1$, $AP_2$. The transforming behaviour of all-passes $AP_1$, $AP_2$ is selected in such a way that Hilbert signals $h_1(t)$ and $h_2(t)$ are supplied to the two outputs within the desired frequency range, of which Hilbert signals a signal $h_1(t)$ or $h_2(t)$ represents substantially the Hilbert transformation of the respective other signal $h_2(t)$ or $h_1(t)$.

Figure 5:
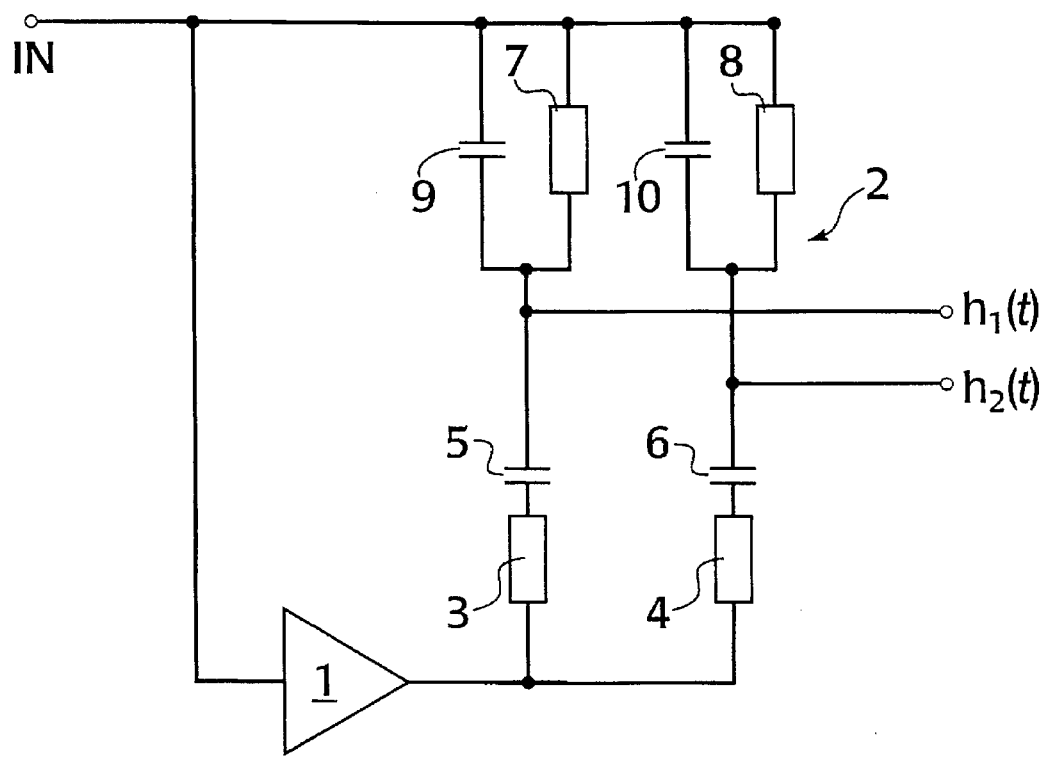
FIG. 5 shows an embodiment of the Hilbert circuit.

FIG. 5 shows in detail the possible arrangement of the Hilbert circuit HS in accordance with FIG. 4. In this circuit the input IN is connected in the known manner with an amplifier 1 and a bridge circuit 2 whose two branches are connected with the output of amplifier 1.

The two branches of the bridge circuit 2 are each formed by a resistor 3, 4 with a capacitor 5, 6 and by the coupling in parallel of a resistor 7, 8 with a condensor 9, 10 which is connected to each of said branch, the components in both branches being provided with different dimensions. The two output signals $h_1(t)$ and $h_2(t)$ are tapped from the connecting points of the series R/C elements with the parallel R/C elements. Resistors and capacitors should be selected with suitable ratings.

Figure 6:
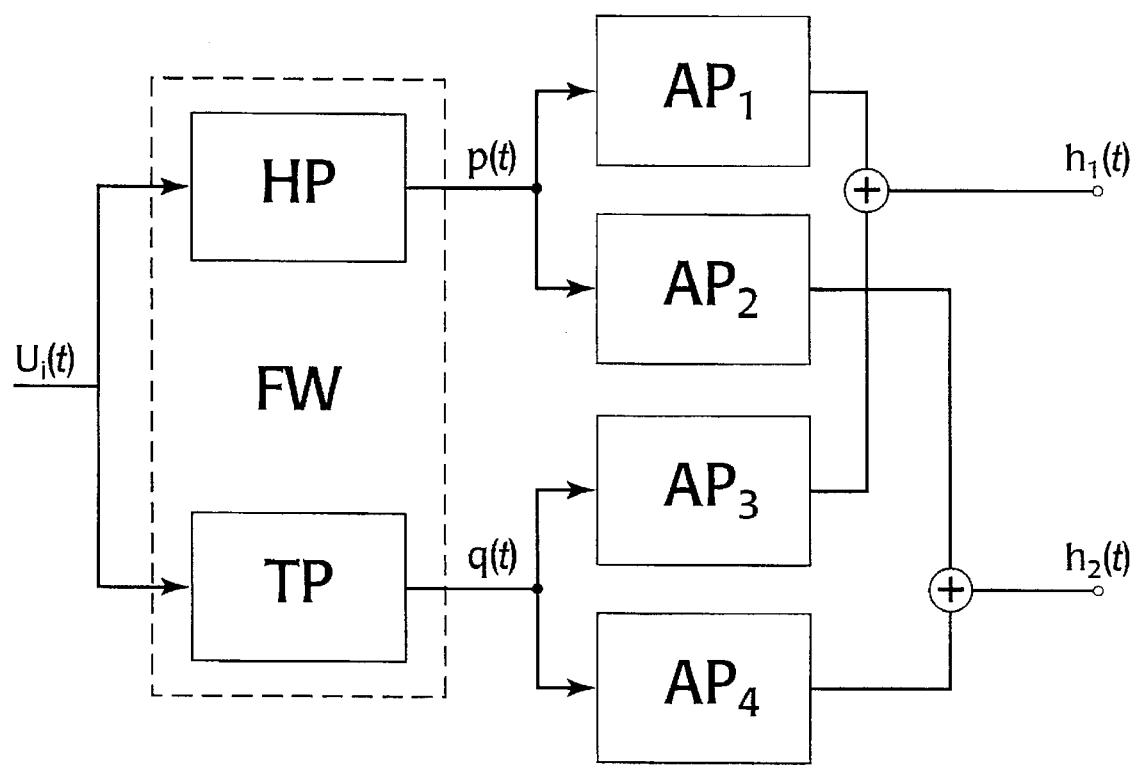
FIG. 6 shows a block diagram of a variation of the Hilbert circuit.

If the frequency range for the Hilbert transformation is not sufficiently narrow in accordance with FIGS. 4 and 5, a frequency separating filter FW may be provided which, for example, consists of a highpass HP and lowpass TP, as is shown in FIG. 6. The partial signals p(t) and q(t) are transformed separately by means of several pairs of all-passes $AP_1$, $AP_2$; $AP_3$, $AP_4$ and added thereafter in order to obtain the Hilbert signals $h_1(t)$ and $h_2(t)$.

Figure 7:
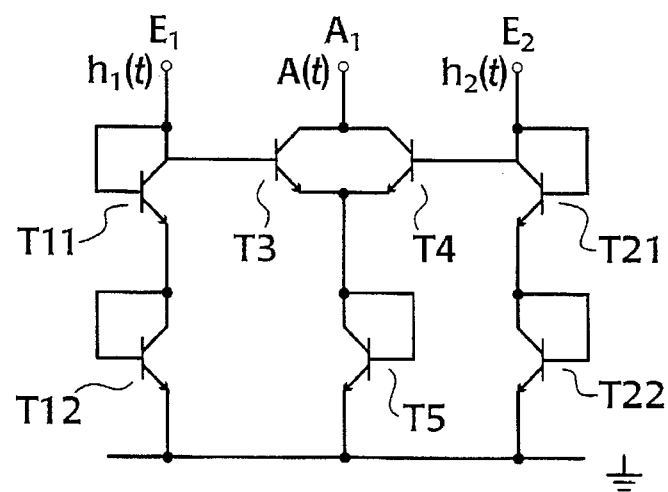
FIG. 7 shows an embodiment of the logic circuit.

FIG. 7 shows a logic circuit which generates the signal:

$$A(t) = \sqrt{V h_1^2(t) + h_2^2(t)} \quad .$$

on output $A_1$ from the signals $h_1$ (t) and $h_2$ (t) that are supplied to inputs $E_1$ and $E_2$.

Such a circuit is known from FERRANTI: Analog IC-Design, 1980, for example. It consists of two series connections of transistors T11, T12, T21 and T22 whose bases are connected with their collectors. The input signals $h_1(t)$ and $h_2(t)$ to be combined are supplied to said series circuits. Said series connections are further connected to the bases of two transistors T3, T4 connected in parallel. A further transistor T5 is connected to these in series. The base of transistor T5 is connected to its collector. A current A(t), which is equivalent to $$A(t) = \sqrt{V h_1^2(t) + h_2^2(t)} \quad ,$$

flows through the transistors T3, T4, whereby $h_1(t)$ and $h_2(t)$ are the input currents.

Figure 8:
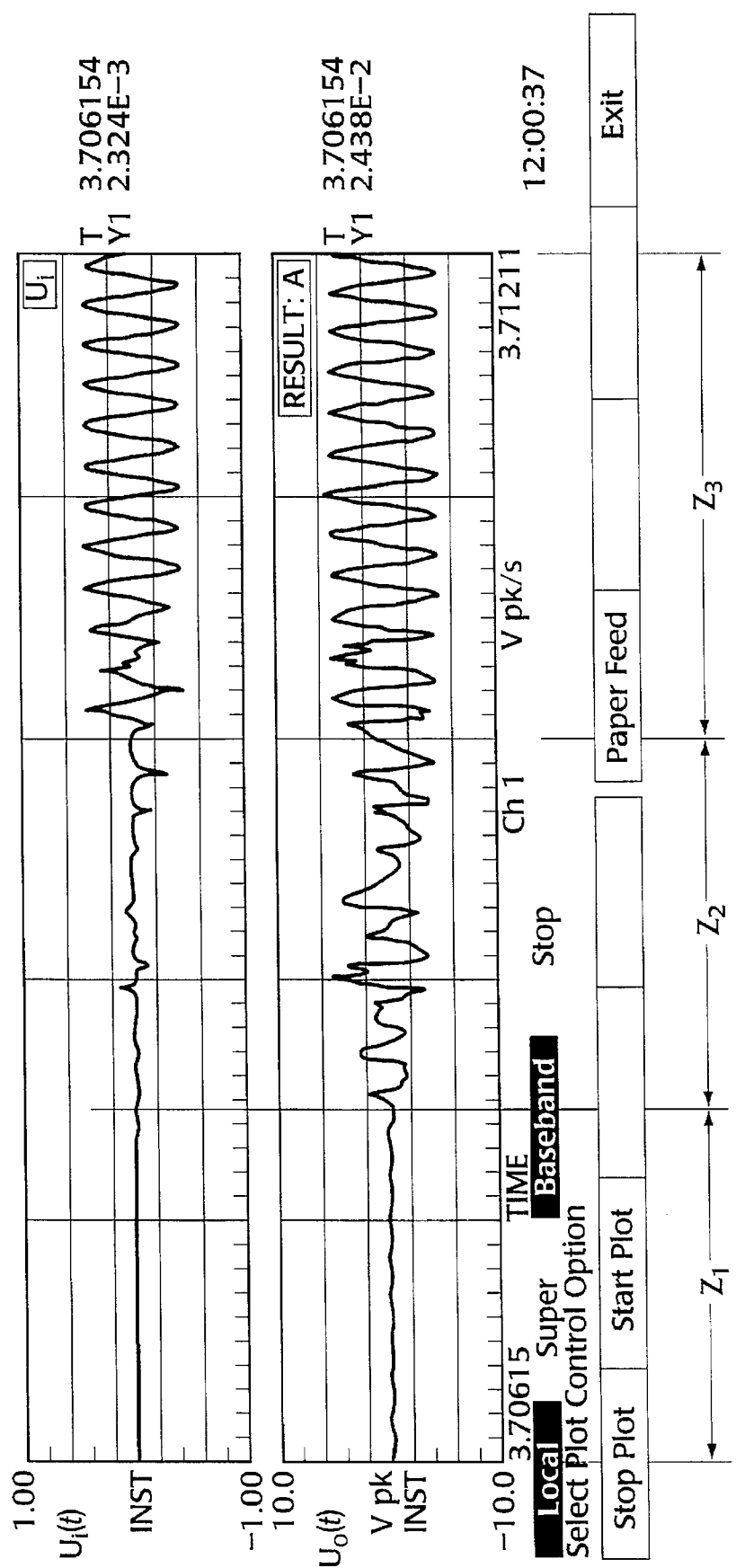
FIGS. 8 and 9 show diagrams of the input and output signals.

The circuit in accordance with the invention, in particular in the embodiment of FIG. 1, acts as contrast amplifier which suppresses noise. FIG. 8 shows that the response time is actually virtually zero. The upper curve shows the input signal $u_i(t)$, the lower curve shows the output signal $u_o(t)$. The input signal $u_i(t)$ is zero during the first period $Z_1$, small during the second period $Z_2$, and large during the third period $Z_3$. The amplitude of the output signal is substantially independent of the amplitude of the input signal.

Figure 9:
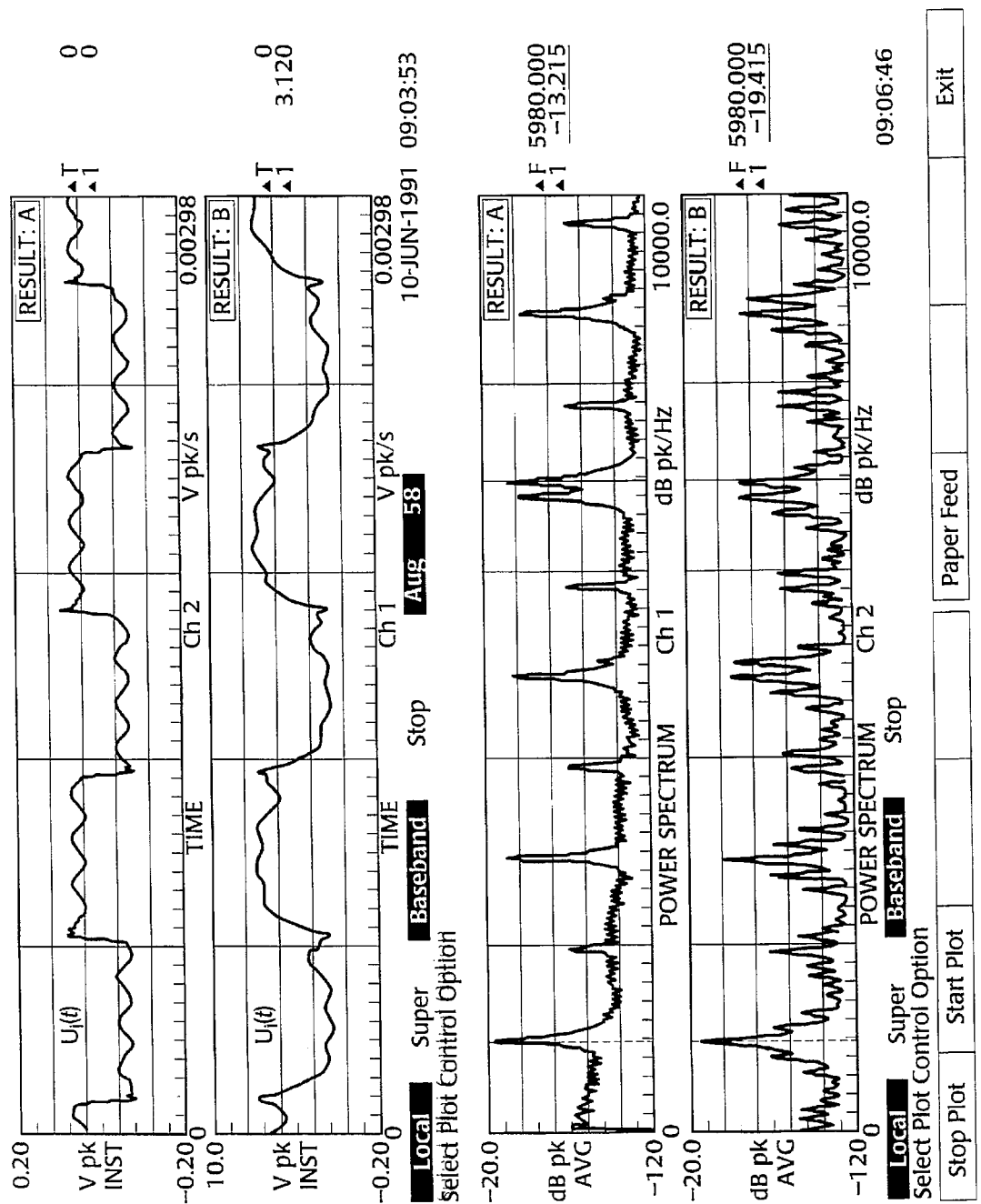

FIG. 9 shows the effect as contrast amplifier. The upper curves shows the input signal $u_i(t)$, the lower the output signal $u_o(t)$. The input signal $u_i(t)$ consists of a rectangular signal with an overlaid sinusoidal oscillation. In the output signal $u_o(t)$ represented below, the rectangular signal is still clearly visible, whereas the sinusoidal signal has substantially been smoothed.

The two lower curves of FIG. 9 show the spectral distribution of the input signal $u_i(t)$ and the output signal $u_o(t)$. The important aspect is that in the input signal $u_i(t)$ the peak value is approx. 13 dB over the minimum value, whereas in the output signal $u_o(t)$ the peak value is approx. 19 dB over the minimum value.

I claim:

1. A method for processing analog audio signals for hearing aids, comprising the steps of:

generating two Hilbert signals $h_1(t)$ and $h_2(t)$ directly from an input signal $u_i(t)$;

generating a momentary amplitude signal $A(t)$ by taking the square root of the sum of the squares of the two Hilbert signals $h_1(t)$ and $h_2(t)$, with the Hilbert signals having an energy spectrum equivalent to the input signal across the entire frequency range, said momentary amplitude signal $A(t)$ having an amplitude proportional to the amplitude of the input signal $u_i(t)$; and dividing a parallel input signal, which is the same as the input signal $u_i(t)$ used to generate the Hilbert signals, by the sum of the momentary amplitude signal $A(t)$ and a constant signal K, in a feed forward configuration, to generate an output signal $u_o(t)$.

2. A method for processing analog audio signals for hearing aids, comprising the steps of:

generating two Hilbert signals $h_1(t)$ and $h_2(t)$ directly from an input signal $u_i(t)$;

generating a momentary amplitude signal $A(t)$ by taking the square root of the sum of the squares of the two Hilbert signals $h_1(t)$ and $h_2(t)$, with the Hilbert signals having an energy spectrum equivalent to the input signal across the entire frequency range, said momentary amplitude signal $A(t)$ having an amplitude proportional to the amplitude of the input signal $u_i(t)$; and amplifying a parallel input signal, which is the same as the input signal $u_i(t)$ used to generate the Hilbert signals, based on the momentary amplitude signal $A(t)$ in a feed forward configuration to generate an output signal $u_o(t)$.

3. An apparatus for processing an analog audio input signal into an output signal for use in a hearing aid, the apparatus comprising:

an amplitude signal circuit including:

(i) a Hilbert circuit for receiving the input signal and generating two Hilbert signals $h_1(t)$ and $h_2(t)$ based on the input signal, said Hilbert circuit comprising:

(a) a crossover network for dividing the input signal into two separate frequency band signals;

(b) a first pair of all-pass circuits connected to said crossover for receiving one of said frequency band signals and generating two phase-shifted outputs;

(c) a second pair of all-pass circuits connected to said crossover for receiving the other of said frequency band signals and generating two phase shifted outputs;

(d) a first adder connected to two of said all-pass circuits for adding said respective phase-shifted outputs to generate one of said Hilbert signals $h_1(t)$; and (e) a second adder connected to the other two of said all-pass circuits for adding said respective phase-shifted outputs to generate the other of said Hilbert signals $h_2(t)$; and (ii) a logic circuit connected to said Hilbert circuit for receiving said two Hilbert signals $h_1(t)$ and $h_2(t)$ and generating a momentary amplitude signal $A(t)$ equal to the square root of the sum of the squares of the Hilbert signals $h_1(t)$ and $h_2(t)$;

an adjustable signal source for generating an adjustable signal;

an adder connected to said logic circuit and said adjustable signal source for adding the momentary amplitude signal $A(t)$ to said adjustable signal to produce a divisor signal; and a divider circuit connected to said adder for dividing the input signal $u_i(t)$ by said divisor signal to generate the output signal $u_o(t)$.

4. The apparatus according to claim 3, wherein the all-pass circuits connected to said first adder have their outputs phase-shifted by the same amount; and the all-pass circuits connected to said second adder have their outputs phase-shifted by the same amount.

5. The apparatus according to claim 4, wherein said first adder is connected to one of said all-pass circuits from said first pair and one of said all-pass circuits from said second pair; and said second adder is connected to the other of said all-pass circuits from said first pair and the other of said all-pass circuits from said second pair.

6. An apparatus for processing an analog audio input signal into an output signal for use in a hearing aid, the apparatus comprising:

an amplitude signal circuit including:

(i) a Hilbert circuit for directly receiving the input signal and generating two Hilbert signals $h_1(t)$ and $h_2(t)$ based on the input signal; and (ii) a logic circuit connected to said Hilbert circuit for receiving said two Hilbert signals $h_1(t)$ and $h_2(t)$ and generating a momentary amplitude signal $A(t)$ equal to the square root of the sum of the squares of the Hilbert signals $h_1(t)$ and $h_2(t)$, with the Hilbert signals having an energy spectrum equivalent to the input signal across the entire frequency range;

a non-linear transformer connected to said logic circuit for generating a control signal based on said momentary amplitude signal $A(t)$; and a voltage-controlled amplifier connected to said non-linear transformer, said voltage-controlled amplifier being controlled by said control signal for amplifying a parallel input signal, which is the same as the input signal received by said Hilbert circuit, in a feed forward configuration.

7. The apparatus according to claim 6, further including:

a timer connected in series with said non-linear transformer adapted for time-selective transforming functions.

8. An apparatus for processing an analog audio input signal into an output signal for use in a hearing aid, the apparatus comprising:

(1) an amplitude signal circuit including:

(i) a Hilbert circuit for receiving the input signal and generating two Hilbert signals $h_1(t)$ and $h_2(t)$ based on the input signal, said Hilbert circuit comprises:

(a) a crossover for dividing the input signal into two separate frequency band signals;

(b) a first pair of all-pass circuits connected to said crossover for receiving one of said frequency band signals and generating two phase-shifted outputs;

(c) a second pair of all-pass circuits connected to said crossover for receiving the other of said frequency band signals and generating two phase shifted outputs;

(d) a first adder connected to two of said all-pass circuits for adding said respective phase-shifted outputs to generate one of said Hilbert signals $h_1(t)$; and (e) a second adder connected to the other two of said all-pass circuits for adding said respective phase-shifted outputs to generate the other of said Hilbert signals $h_2(t)$; and (ii) a logic circuit connected to said Hilbert circuit for receiving said two Hilbert signals $h_1(t)$ and $h_2(t)$ and generating a momentary amplitude signal A(t) equal to the square root of the sum of the squares of the Hilbert signals $h_1(t)$ and $h_2(t)$;

(2) a non-linear transformer connected to said logic circuit for generating a control signal based on said momentary amplitude signal A(t); and (3) a voltage-controlled amplifier connected to said non-linear transformer, said voltage-controlled amplifier amplifying the input signal as controlled by said control signal.

9. The apparatus according to claim 8, wherein the all-pass circuits connected to said first adder have their outputs phase-shifted by the same amount; and the all-pass circuits connected to said second adder have their outputs phase-shifted by the same amount.

10. The apparatus according to claim 9, wherein said first adder is connected to one of said all-pass circuits from said first pair and one of said all-pass circuits from said second pair; and said second adder is connected to the other of said all-pass circuits from said first pair and the other of said all-pass circuits from said second pair.

11. A method for processing analog audio signals for hearing aids, comprising the steps of:

generating two Hilbert signals $h_1(t)$ and $h_2(t)$ directly from an input signal $u_i(t)$;

generating a momentary amplitude signal A(t) by taking the square root of the sum of the squares of the two Hilbert signals $h_1(t)$ and $h_2(t)$, with the Hilbert signals having an energy spectrum equivalent to the input signal across the entire frequency range, said momentary amplitude signal A(t) having an amplitude proportional to the amplitude of the input signal $u_i(t)$; and dividing a parallel Hilbert signal, which is the same as one of said Hilbert signals, by the sum of the momentary amplitude signal A(t) and a constant signal K in a feed forward configuration to generate an output signal $u_o(t)$.

* * * * *